United States Patent
Kang (10) Patent No.: US 9,190,140 B2
(45) Date of Patent: Nov. 17, 2015

(54) SEMICONDUCTOR DEVICES

(71) Applicant: SK hynix Inc., Incheon-si Gyeonggi-do (KR)

(72) Inventor: Tae Jin Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 163 days.

(21) Appl. No.: 14/174,647

(22) Filed: Feb. 6, 2014

(65) Prior Publication Data

US 2015/0221359 A1 Aug. 6, 2015

(51) Int. Cl.
*G11C 8/00* (2006.01)
*G11C 11/4096* (2006.01)
*G11C 11/408* (2006.01)
*G11C 11/4076* (2006.01)

(52) U.S. Cl.
CPC ........ *G11C 11/4096* (2013.01); *G11C 11/4076* (2013.01); *G11C 11/4087* (2013.01)

(58) Field of Classification Search
CPC ............................ G11C 14/0009; G11C 5/066
USPC ............................ 365/230.03, 230.02, 230.06
See application file for complete search history.

(56) References Cited

U.S. PATENT DOCUMENTS

| 6,925,017 | B2* | 8/2005 | Takemura | .......... G11C 11/4076 |
| | | | | 257/E21.656 |
| 2003/0081449 | A1* | 5/2003 | Beucler | .................... G11C 8/16 |
| | | | | 365/154 |
| 2012/0068719 | A1 | 3/2012 | Nin | |

FOREIGN PATENT DOCUMENTS

KR 1020050049236 A 5/2005

* cited by examiner

*Primary Examiner* — Han Yang
(74) *Attorney, Agent, or Firm* — William Park & Associates Ltd.

(57) ABSTRACT

A semiconductor device includes a section signal generator and a decoder. The section signal generator generates a section signal by retarding a pre-section signal including a pulse created during a read operation or a write operation by a delay time that is set according to a level combination of first and second test mode signals. The decoder decodes address signals in response to a pulse of the section signal to generate column selection signals, one of which is selectively enabled, to store an external data in a memory cell of an internal circuit or to output a data stored in a memory cell of an internal circuit.

20 Claims, 6 Drawing Sheets

| TMCMD<2> | TMCMD<1> | TM<4> | TM<3> | TM<2> | TM<1> |
|---|---|---|---|---|---|
| L | L | L | L | L | H |
| L | H | L | L | H | H |
| H | L | L | H | H | H |
| H | H | H | H | H | H |

| TMCMD<2> | TMCMD<1> | SEL<4> | SEL<3> | SEL<2> | SEL<1> |
|---|---|---|---|---|---|
| L | L | L | L | L | H |
| L | H | L | L | H | L |
| H | L | L | H | L | L |
| H | H | H | L | L | L |

FIG. 6

SEMICONDUCTOR DEVICES

BACKGROUND

1. Technical Field

Embodiments of the present disclosure relate to semiconductor devices.

2. Related Art

Semiconductor memory devices, for example, dynamic random access memory (DRAM) devices may have row address paths, column address paths and data paths. The row address path may be created during an operation for selecting a word line using a row address signal supplied from an external device and for amplifying the data stored in at least one memory cell connected to the selected word line using at least one sense amplifier, and the column address path may be created during an operation for selecting one of a plurality of output enable signals using a column address signal. Further, the data path may be created during an operation for transmitting data on bit lines to an external device through input/output (I/O) lines, sense amplifiers and data output buffers, the sense amplifiers and data output buffers. The operation (hereinafter, referred to as a column operation) relating to the column address path may be controlled by a column path circuit which is suitable for including a column decoder. The column path circuit may decode the column address signal to selectively enable any one of the plurality of column selection signals and may transmit the data on the bit line selected by the enabled column selection signal to the I/O line.

In general, the semiconductor device such as the DRAM device may be suitable for including a plurality of memory banks, and each of the memory banks may include a plurality of memory cells. Addresses allocated to the memory cells of one of the memory banks may be identical to addresses allocated to the memory cells of another memory bank. Thus, the semiconductor device may simultaneously output the data of the memory cells that are disposed in respective ones of the memory banks to have the same address. To this end, the column path circuit may decode the column address signals to selectively enable any one of the plurality of column selection signals and may perform the column operation for simultaneously transmitting the data on the bit lines of the memory banks selected by the selected column selection signal to the I/O lines.

SUMMARY

Various embodiments are directed to semiconductor devices.

According to some embodiments, a semiconductor device includes a section signal generator and a decoder. The section signal generator generates a section signal by retarding a pre-section signal including a pulse created during a read operation or a write operation by a delay time that is set according to a level combination of first and second test mode signals. The decoder decodes address signals in response to a pulse of the section signal to generate column selection signals, one of which is selectively enabled, to store an external data in a memory cell of an internal circuit or to output a data stored in a memory cell of an internal circuit.

According to further embodiments, a semiconductor device includes a test mode signal generator, a section signal generator and a decoder. The test mode signal generator generates first and second test mode signals which are sequentially enabled according to a logic level of a test command signal. The section signal generator generates a section signal by retarding a pre-section signal by a delay time that is set according to a level combination of the first and second test mode signals. The decoder decodes address signals in response to a pulse of the section signal to generate column selection signals, one of which is selectively enabled, to store an external data in a memory cell of an internal circuit or to output a data stored in a memory cell of an internal circuit.

According to further embodiments, a semiconductor device includes a pre-section signal generator, a section signal generator and a decoder. The pre-section signal generator generates a pre-section signal including a pulse which is created in response to a read command signal or a write command signal supplied from an external device. The section signal generator generates a section signal by retarding the pre-section signal by a delay time that is set according to a level combination of first and second test mode signals. The decoder decodes address signals in response to a pulse of the section signal to generate column selection signals, one of which is selectively enabled, to store an external data in a memory cell of an internal circuit or to output a data stored in a memory cell of an internal circuit.

According to other embodiments, a semiconductor device includes a test mode signal generator suitable for generating first and second test mode signals which are enabled according to a logic level of a test command signal; a section signal generator suitable for generating a section signal by retarding a pre-section signal by a delay time that is set according to a voltage level combination of the first and second test mode signals; and a pre-section signal generator suitable for generating the pre-section signal including a pulse which is created in response to receiving a read command signal or a write command signal.

According to further embodiments, the semiconductor device, wherein the section signal generator includes a delay signal generator suitable for retarding the pre-section signal by a delay time, which is set according to a level combination of the first and second test mode signals, to generate first and second delay signals. a selection signal generator suitable for generating first and second selection signals, one of which is selectively enabled according to a logic level of a test command signal; and a multiplexer suitable for outputting one of the first and second delay signals as the section signal according to a level combination of the first and second selection signals.

According to further embodiments, the semiconductor device, wherein the delay signal generator includes, a first delay unit configured to be activated to latch the pre-section signal and suitable for retarding the latched pre-section signal to generate the first delay signal, when the first test mode signal is enabled and a second delay unit configured to be activated to latch the first delay signal and suitable for retarding the latched first delay signal to generate the second delay signal, when the second test mode signal is enabled, wherein if only the first test mode signal is enabled then only the first delay unit is activated and the second delay unit is not activated.

According to further embodiments, the semiconductor device, wherein the second delay signal has a greater delay time than the first delay signal.

According to further embodiments, the semiconductor device, wherein the multiplexer includes, a first transmitter suitable for outputting the first delay signal as the section signal when the first selection signal is enabled and a second transmitter suitable for outputting the second delay signal as the section signal when the second selection signal is enabled.

BRIEF DESCRIPTION OF THE DRAWINGS

Embodiments of the present invention will become more apparent in view of the attached drawings and accompanying detailed description, in which.

DETAILED DESCRIPTION OF THE EMBODIMENTS

Various embodiments of the present invention will be described hereinafter with reference to the accompanying drawings. However, the embodiments described herein are for illustrative purposes only and are not intended to limit the scope of the present invention.

Figure 1:
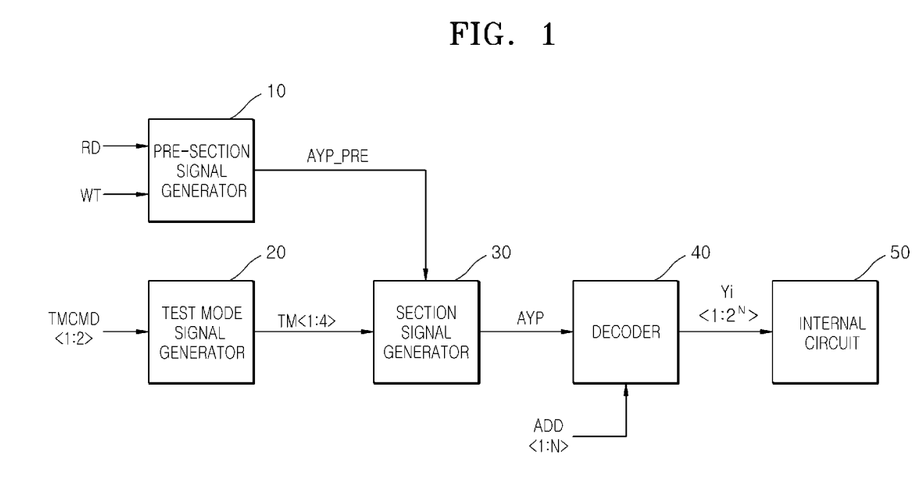
FIG. 1 is a block diagram illustrating a configuration of a semiconductor device according to an embodiment.

Referring to FIG. 1, a semiconductor device according to an embodiment may include a pre-section signal generator 10, a test mode signal generator 20, a section signal generator 30, a decoder 40 and an internal circuit 50.

The pre-section signal generator 10 may generate a pre-section signal AYP_PRE including a pulse which is created when a read command signal RD or a write command signal WT is inputted thereto. The read command signal RD may be supplied from an external device such as a controller for a read operation of the semiconductor device, and the write command signal WT may be supplied from the external device such as a controller for a write operation of the semiconductor device.

The test mode signal generator 20 may generate first to fourth test mode signals TM<1:4> which are sequentially enabled according to logic levels of first and second test command signals TMCMD<1:2>. The first and second test command signals TMCMD<1:2> may be supplied from an external device such as a controller to control a delay time of a section signal AYP for generating column selection signals Yi<1:2$^N$> (wherein, "N" denotes a natural number).

The section signal generator 30 may generate the section signal AYP by retarding the pre-section signal AYP_PRE by a delay time that is set according to logic levels of the first to fourth test mode signals TM<1:4>.

The decoder 40 may decode address signals ADD<1:N> in response to a pulse of the section signal AYP to generate the column selection signals Yi<1:2$^N$>, one of which is selectively enabled.

The internal circuit 50 may output data stored in memory cells selected by the enabled one of the column selection signals Yi<1:2$^N$> during the read operation and may store data supplied from an external device in memory cells selected by the enabled one of the column selection signals Yi<1:2$^N$> during the write operation.

Figure 2:
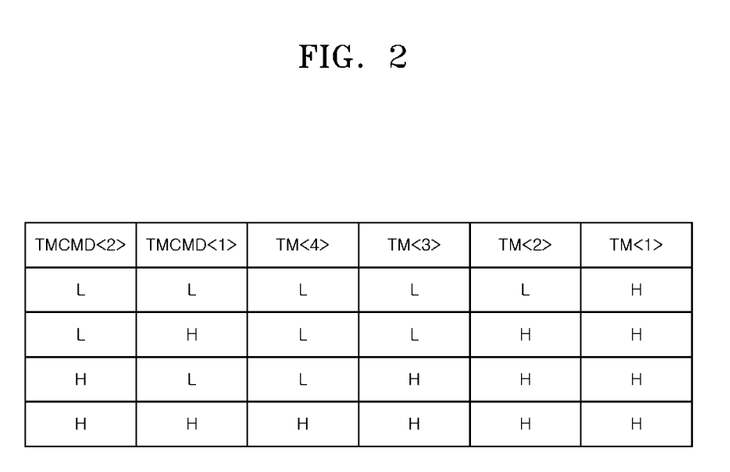
FIG. 2 is a logic table illustrating an operation of a test mode signal generator included in the semiconductor device of FIG. 1.

An operation of the test mode signal generator 20 for generating the first to fourth test mode signals TM<1:4>, which are sequentially enabled according to logic levels of the first and second test command signals TMCMD<1:2>, will be described more fully hereinafter with reference to FIG. 2.

The test mode signal generator 20 may generate the first test mode signal TM<1> having a logic "high(H)" level, the second test mode signal TM<2> having a logic "low(L)" level, the third test mode signal TM<3> having a logic "low (L)" level, and the fourth test mode signal TM<4> having a logic "low(L)" level when the first test command signal TMCMD<1> having a logic "low(L)" level and the second test command signal TMCMD<2> having a logic "low(L)" level are inputted to the test mode signal generator 20.

The test mode signal generator 20 may generate the first test mode signal TM<1> having a logic "high(H)" level, the second test mode signal TM<2> having a logic "high(H)" level, the third test mode signal TM<3> having a logic "low (L)" level, and the fourth test mode signal TM<4> having a logic "low(L)" level when the first test command signal TMCMD<1> having a logic "high(H)" level and the second test command signal TMCMD<2> having a logic "low(L)" level are inputted to the test mode signal generator 20.

The test mode signal generator 20 may generate the first test mode signal TM<1> having a logic "high(H)" level, the second test mode signal TM<2> having a logic "high(H)" level, the third test mode signal TM<3> having a logic "high (H)" level, and the fourth test mode signal TM<4> having a logic "low(L)" level when the first test command signal TMCMD<1> having a logic "low(L)" level and the second test command signal TMCMD<2> having a logic "high(H)" level are inputted to the test mode signal generator 20.

The test mode signal generator 20 may generate the first test mode signal TM<1> having a logic "high(H)" level, the second test mode signal TM<2> having a logic "high(H)" level, the third test mode signal TM<3> having a logic "high (H)" level, and the fourth test mode signal TM<4> having a logic "high(H)" level when the first test command signal TMCMD<1> having a logic "high(H)" level and the second test command signal TMCMD<2> having a logic "high(H)" level are inputted to the test mode signal generator 20.

Figure 3:
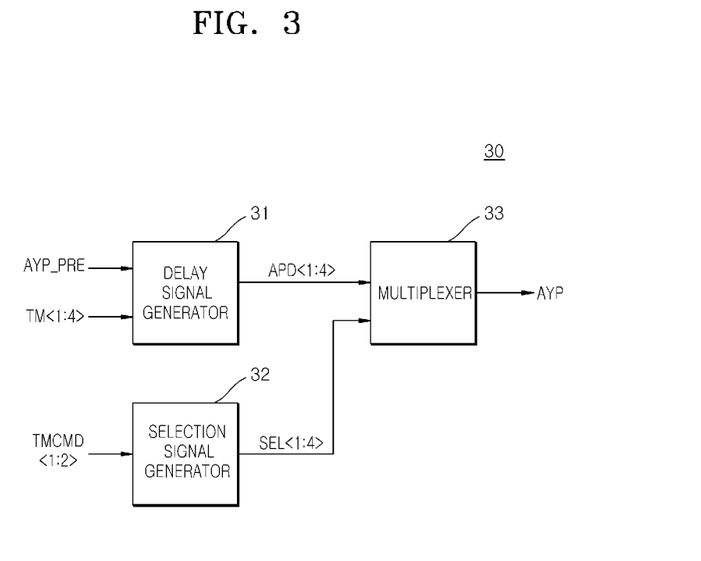
FIG. 3 is a block diagram illustrating a section signal generator included in the semiconductor device of FIG. 1.

A configuration of the section signal generator 30 will be described more fully hereinafter with reference to FIG. 3.

The section signal generator 30 may include a delay signal generator 31, a selection signal generator 32 and a multiplexer 33.

The delay signal generator 31 may retard the pre-section signal AYP_PRE by a delay time, which is set according to logic levels of the first to fourth test mode signals TM<1:4>, to generate first to fourth delay signals APD<1:4>.

The selection signal generator 32 may generate first to fourth selection signals SEL<1:4> selectively enabled according to logic levels of the first and second test command signals TMCMD<1:2>.

The multiplexer 33 may output one of the first to fourth delay signals APD<1:4> as the section signal AYP according to logic levels of the first to fourth selection signals SEL<1:4>.

Figure 4:
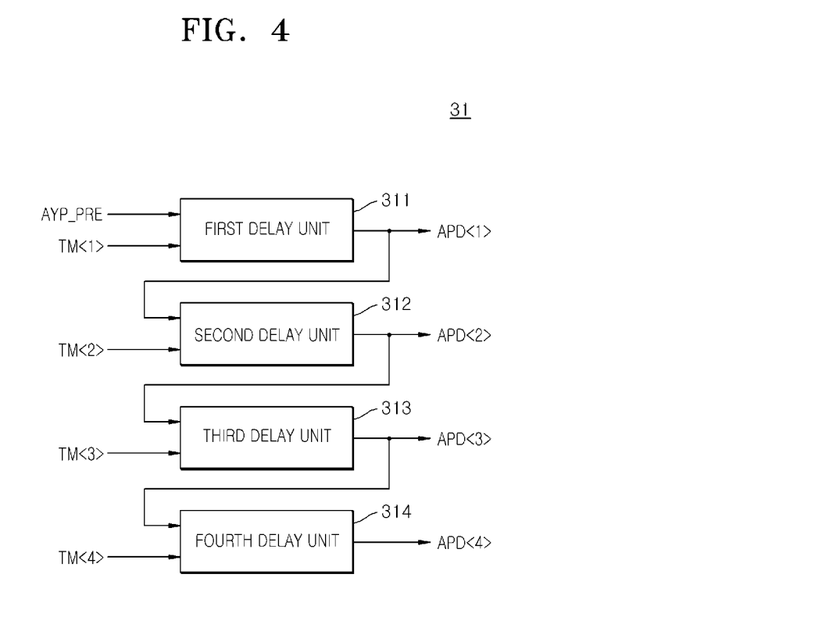
FIG. 4 is a block diagram illustrating a delay signal generator included in the section signal generator of FIG. 3.

A configuration of the delay signal generator 31 will be described more fully hereinafter with reference to FIG. 4.

The delay signal generator 31 may include first to fourth delay units 311, 312, 313 and 314.

The first delay unit 311 may be activated to latch the pre-section signal AYP_PRE when the first test mode signal TM<1> is enabled to have a logic "high" level, and may retard the latched pre-section signal AYP_PRE to generate the first delay signal APD<1>. That is, the first delay signal APD<1> may be generated by retarding the pre-section signal AYP_PRE by a first delay time corresponding to a delay time of the first delay unit 311.

The second delay unit 312 may be activated to latch the first delay signal APD<1> when the second test mode signal TM<2> is enabled to have a logic "high" level, and may retard the latched first delay signal APD<1> to generate the second delay signal APD<2>. That is, the second delay signal APD<2> may be generated by retarding the pre-section signal AYP_PRE by a second delay time corresponding to a total delay time of the first and second delay units 311 and 312.

The third delay unit 313 may be activated to latch the second delay signal APD<2> when the third test mode signal TM<3> is enabled to have a logic "high" level, and may retard the latched second delay signal APD<2> to generate the third delay signal APD<3>. That is, the third delay signal APD<3> may be generated by retarding the pre-section signal AYP_PRE by a third delay time corresponding to a total delay time of the first, second and third delay units 311, 312 and 313.

The fourth delay unit 314 may be activated to latch the third delay signal APD<3> when the fourth test mode signal TM<4> is enabled to have a logic "high" level, and may retard the latched third delay signal APD<3> to generate the fourth delay signal APD<4>. That is, the fourth delay signal APD<4> may be generated by retarding the pre-section signal AYP_PRE by a fourth delay time corresponding to a total delay time of the first, second, third and fourth delay units 311, 312, 313 and 314.

Each of the first to fourth delay units 311, 312, 313 and 314 may be realized using a delay circuit including a flip-flop or a latch circuit.

Figure 5:
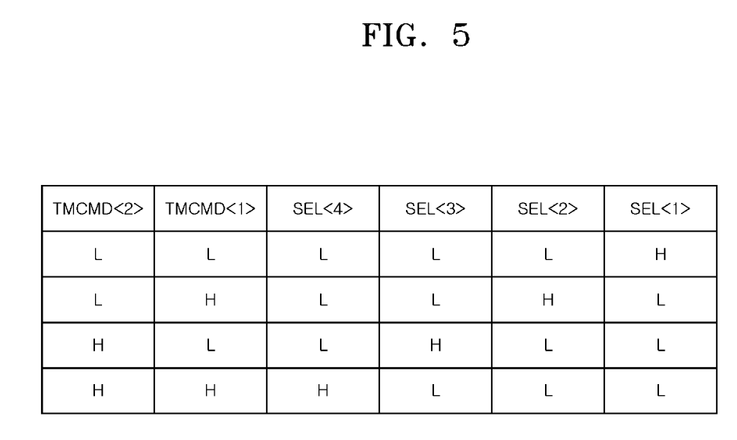
FIG. 5 is a logic table illustrating an operation of a selection signal generator included in the section signal generator of FIG. 3.

An operation of the selection signal generator 32 for generating the first to fourth selection signals SEL<1:4>, one of which is selectively enabled according to logic levels of the first and second test command signals TMCMD<1:2>, will be described more fully hereinafter with reference to FIG. 5.

The selection signal generator 32 may generate the first selection signal SEL<1> having a logic "high(H)" level, the second selection signal SEL<2> having a logic "low(L)" level, the third selection signal SEL<3> having a logic "low (L)" level, and the fourth selection signal SEL<4> having a logic "low(L)" level when the first test command signal TMCMD<1> having a logic "low(L)" level and the second test command signal TMCMD<2> having a logic "low(L)" level are inputted to the selection signal generator 32.

The selection signal generator 32 may generate the first selection signal SEL<1> having a logic "low(L)" level, the second selection signal SEL<2> having a logic "high(H)" level, the third selection signal SEL<3> having a logic "low (L)" level, and the fourth selection signal SEL<4> having a logic "low(L)" level when the first test command signal TMCMD<1> having a logic "high(H)" level and the second test command signal TMCMD<2> having a logic "low(L)" level are inputted to the selection signal generator 32.

The selection signal generator 32 may generate the first selection signal SEL<1> having a logic "low(L)" level, the second selection signal SEL<2> having a logic "low(L)" level, the third selection signal SEL<3> having a logic "high (H)" level, and the fourth selection signal SEL<4> having a logic "low(L)" level when the first test command signal TMCMD<1> having a logic "low(L)" level and the second test command signal TMCMD<2> having a logic "high(H)" level are inputted to the selection signal generator 32.

The selection signal generator 32 may generate the first selection signal SEL<1> having a logic "low(L)" level, the second selection signal SEL<2> having a logic "low(L)" level, the third selection signal SEL<3> having a logic "low (L)" level, and the fourth selection signal SEL<4> having a logic "high(H)" level when the first test command signal TMCMD<1> having a logic "high(H)" level and the second test command signal TMCMD<2> having a logic "high(H)" level are inputted to the selection signal generator 32.

Figure 6:
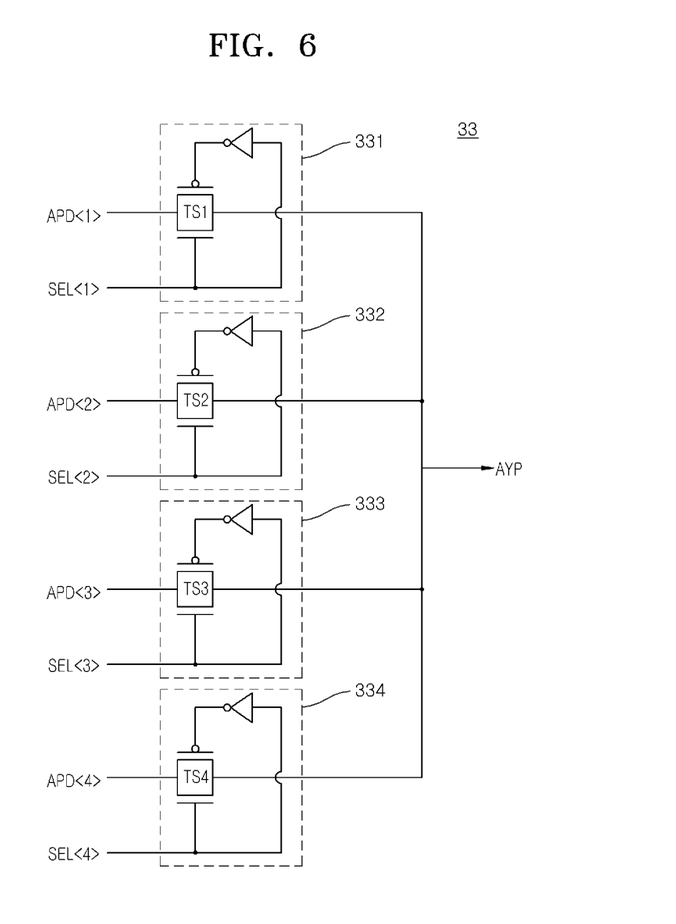
FIG. 6 is a logic circuit diagram illustrating a multiplexer included in the section signal generator of FIG. 3.

A configuration of the multiplexer 33 will be described more fully hereinafter with reference to FIG. 6.

The multiplexer 33 may include first to fourth transmitters 331, 332, 333 and 334.

The first transmitter 331 may be realized using a first transfer gate TS1, and the first transfer gate TS1 may be turned on in response to the first selection signal SEL<1> having a logic "high" level to output the first delay signal APD<1> as the section signal AYP.

The second transmitter 332 may be realized using a second transfer gate TS2, and the second transfer gate TS2 may be turned on in response to the second selection signal SEL<2> having a logic "high" level to output the second delay signal APD<2> as the section signal AYP.

The third transmitter 333 may be realized using a third transfer gate TS3, and the third transfer gate TS3 may be turned on in response to the third selection signal SEL<3> having a logic "high" level to output the third delay signal APD<3> as the section signal AYP.

The fourth transmitter 334 may be realized using a fourth transfer gate TS4, and the fourth transfer gate TS4 may be turned on in response to the fourth selection signal SEL<4> having a logic "high" level to output the fourth delay signal APD<4> as the section signal AYP.

A write operation of the semiconductor device as set forth above will be described hereinafter in conjunction with an example in which a delay time of the section signal AYP for generating the column selection signal Yi<1:2$^N$> decreases from the second delay time to the first delay time and an example in which a delay time of the section signal AYP for generating the column selection signal Yi<1:2$^N$> increases from the second delay time to the third delay time.

First, in the event that a delay time of the section signal AYP for generating the column selection signal Yi<1:2$^N$> is equal to the second delay time, the first test command signal TMCMD<1> may have a logic "high" level and the second test command signal TMCMD<2> may have a logic "low" level.

The pre-section signal generator 10 may generate the pre-section signal AYP_PRE including a pulse which is created in response to the write command signal WT.

The test mode signal generator 20 may receive the first test command signal TMCMD<1> having a logic "high" level and the second test command signal TMCMD<2> having a logic "low" level to generate the first test mode signal TM<1> having a logic "high" level, the second test mode signal TM<2> having a logic "high" level, the third test mode signal TM<3> having a logic "low" level, and the fourth test mode signal TM<4> having a logic "low" level.

The first delay unit 311 of the delay signal generator 31 may be activated in response to the first test mode signal TM<1> having a logic "high" level to latch the pre-section signal AYP_PRE and may retard the latched pre-section signal AYP_PRE to generate the first delay signal APD<1>. The second delay unit 312 may be activated in response to the second test mode signal TM<2> having a logic "high" level to latch the first delay signal APD<1> and may retard the latched first delay signal APD<1> to generate the second delay signal APD<2>. The third delay unit 313 may be inactivated in response to the third test mode signal TM<3> having a logic "low" level. The fourth delay unit 314 may also be inactivated in response to the fourth test mode signal TM<4> having a logic "low" level.

The selection signal generator 32 may receive the first test command signal TMCMD<1> having a logic "high(H)" level and the second test command signal TMCMD<2> having a logic "low(L)" level to generate the first selection signal SEL<1> having a logic "low(L)" level, the second selection signal SEL<2> having a logic "high(H)" level, the third selection signal SEL<3> having a logic "low(L)" level, and the fourth selection signal SEL<4> having a logic "low(L)" level.

The first transfer gate TS1 of the first transmitter 331 constituting the multiplexer 33 may be turned off in response to the first selection signal SEL<1> having a logic "low" level not to output the first delay signal APD<1> as the section signal AYP. The second transfer gate TS2 of the second transmitter 332 may be turned on in response to the second selection signal SEL<2> having a logic "high" level to output the second delay signal APD<2> as the section signal AYP. The third transfer gate TS3 of the third transmitter 333 may be turned off in response to the third selection signal SEL<3> having a logic "low" level not to output the third delay signal APD<3> as the section signal AYP. The fourth transfer gate TS4 of the fourth transmitter 334 may be turned off in response to the fourth selection signal SEL<4> having a logic "low" level not to output the fourth delay signal APD<4> as the section signal AYP. That is, a delay time of the section signal AYP may be set to the second delay time corresponding to a delay time of the second delay signal APD<2>.

The decoder 40 may decode the address signal ADD<1:N> in response to a pulse of the section signal AYP to generate the column selection signals Yi<1:$2^N$>, one of which is selectively enabled.

The internal circuit 50 may store the data supplied from an external device in memory cells selected by the enabled one of the column selection signals Yi<1:$2^N$>.

That is, a delay time of the section signal AYP for generating the column selection signals Yi<1:$2^N$> may be set to the second delay time corresponding to a total delay time of the first delay unit 311 and the second delay unit 312. In such a case, the third and fourth delay units 313 and 314 may be inactivated to minimize the power consumption of the semiconductor device.

Next, in the event that a delay time of the section signal AYP for generating the column selection signal Yi<1:$2^N$> is reduced from the second delay time to the first delay time, the first test command signal TMCMD<1> may have a logic "low" level and the second test command signal TMCMD<2> may also have a logic "low" level.

The pre-section signal generator 10 may generate the pre-section signal AYP_PRE including a pulse which is created in response to the write command signal WT.

The test mode signal generator 20 may receive the first test command signal TMCMD<1> having a logic "low" level and the second test command signal TMCMD<2> having a logic "low" level to generate the first test mode signal TM<1> having a logic "high" level, the second test mode signal TM<2> having a logic "low" level, the third test mode signal TM<3> having a logic "low" level, and the fourth test mode signal TM<4> having a logic "low" level.

The first delay unit 311 of the delay signal generator 31 may be activated in response to the first test mode signal TM<1> having a logic "high" level to latch the pre-section signal AYP_PRE and may retard the latched pre-section signal AYP_PRE to generate the first delay signal APD<1>. The second delay unit 312 may be inactivated in response to the second test mode signal TM<2> having a logic "low" level. The third delay unit 313 may be inactivated in response to the third test mode signal TM<3> having a logic "low" level. The fourth delay unit 314 may be inactivated in response to the fourth test mode signal TM<4> having a logic "low" level.

The selection signal generator 32 may receive the first test command signal TMCMD<1> having a logic "low(L)" level and the second test command signal TMCMD<2> having a logic "low(L)" level to generate the first selection signal SEL<1> having a logic "high(H)" level, the second selection signal SEL<2> having a logic "low(L)" level, the third selection signal SEL<3> having a logic "low(L)" level, and the fourth selection signal SEL<4> having a logic "low(L)" level.

The first transfer gate TS1 of the first transmitter 331 constituting the multiplexer 33 may be turned on in response to the first selection signal SEL<1> having a logic "high" level to output the first delay signal APD<1> as the section signal AYP. The second transfer gate TS2 of the second transmitter 332 may be turned off in response to the second selection signal SEL<2> having a logic "low" level not to output the second delay signal APD<2> as the section signal AYP. The third transfer gate TS3 of the third transmitter 333 may be turned off in response to the third selection signal SEL<3> having a logic "low" level not to output the third delay signal APD<3> as the section signal AYP. The fourth transfer gate TS4 of the fourth transmitter 334 may be turned off in response to the fourth selection signal SEL<4> having a logic "low" level not to output the fourth delay signal APD<4> as the section signal AYP.

The decoder 40 may decode the address signal ADD<1:N> in response to a pulse of the section signal AYP to generate the column selection signals Yi<1:$2^N$>, one of which is selectively enabled.

The internal circuit 50 may store the data supplied from an external device in memory cells selected by the enabled one of the column selection signals Yi<1:$2^N$>.

That is, a delay time of the section signal AYP for generating the column selection signals Yi<1:$2^N$> may be set to the first delay time corresponding to a delay time of the first delay unit 311. Thus, a delay time of the section signal AYP may be reduced to have the first delay time which is less than the second delay time. In such a case, the second, third and fourth delay units 312, 313 and 314 may be inactivated to minimize the power consumption of the semiconductor device.

Next, in the event that a delay time of the section signal AYP for generating the column selection signal Yi<1:$2^N$> increases from the second delay time to the third delay time, the first test command signal TMCMD<1> may have a logic "low" level and the second test command signal TMCMD<2> may have a logic "high" level.

The pre-section signal generator 10 may generate the pre-section signal AYP_PRE including a pulse which is created in response to the write command signal WT.

The test mode signal generator 20 may receive the first test command signal TMCMD<1> having a logic "low" level and the second test command signal TMCMD<2> having a logic "high" level to generate the first test mode signal TM<1> having a logic "high" level, the second test mode signal TM<2> having a logic "high" level, the third test mode signal TM<3> having a logic "high" level, and the fourth test mode signal TM<4> having a logic "low" level.

The first delay unit 311 of the delay signal generator 31 may be activated in response to the first test mode signal TM<1> having a logic "high" level to latch the pre-section signal AYP_PRE and may retard the latched pre-section signal AYP_PRE to generate the first delay signal APD<1>. The second delay unit 312 may be activated in response to the second test mode signal TM<2> having a logic "high" level to latch the first delay signal APD<1> and may retard the latched first delay signal ATP<1> to generate the second delay signal APD<2>. The third delay unit 313 may be activated in response to the third test mode signal TM<3> having a logic "high" level to latch the second delay signal APD<2> and may retard the latched second delay signal ATP<2> to generate the third delay signal APD<3>. The fourth delay unit 314 may be inactivated in response to the fourth test mode signal TM<4> having a logic "low" level.

The selection signal generator 32 may receive the first test command signal TMCMD<1> having a logic "low(L)" level and the second test command signal TMCMD<2> having a logic "high(H)" level to generate the first selection signal SEL<1> having a logic "low(L)" level, the second selection signal SEL<2> having a logic "low(L)" level, the third selection signal SEL<3> having a logic "high(H)" level, and the fourth selection signal SEL<4> having a logic "low(L)" level.

The first transfer gate TS1 of the first transmitter 331 constituting the multiplexer 33 may be turned off in response to the first selection signal SEL<1> having a logic "low" level not to output the first delay signal APD<1> as the section signal AYP. The second transfer gate TS2 of the second transmitter 332 may be turned off in response to the second selection signal SEL<2> having a logic "low" level not to output the second delay signal APD<2> as the section signal AYP. The third transfer gate TS3 of the third transmitter 333 may be turned on in response to the third selection signal SEL<3> having a logic "high" level to output the third delay signal APD<3> as the section signal AYP. The fourth transfer gate TS4 of the fourth transmitter 334 may be turned off in response to the fourth selection signal SEL<4> having a logic "low" level not to output the fourth delay signal APD<4> as the section signal AYP.

The decoder 40 may decode the address signal ADD<1:N> in response to a pulse of the section signal AYP to generate the column selection signals Yi<1:$2^N$>, one of which is selectively enabled.

The internal circuit 50 may store the data supplied from an external device in memory cells selected by the enabled one of the column selection signals Yi<1:$2^N$>.

That is, a delay time of the section signal AYP for generating the column selection signals Yi<1:$2^N$> may be set to the third delay time corresponding to a total delay time of the first, second and third delay units 311, 312 and 313. Thus, a delay time of the section signal AYP may increase to have the third delay time which is greater than the second delay time. In such a case, the fourth delay unit 314 may be inactivated to minimize the power consumption of the semiconductor device.

The semiconductor device having the aforementioned configuration may selectively activate respective ones of the plurality of delay units controlling a delay time of the section signal AYP for generating the column selection signals Yi<1:$2^N$> to minimize the power consumption thereof.

What is claimed is:

1. A semiconductor device comprising:
   a section signal generator suitable for generating a section signal by retarding a pre-section signal including a pulse created during a read operation or a write operation by a delay time that is set according to a level combination of first and second test mode signals; and
   a decoder suitable for decoding address signals in response to a pulse of the section signal to generate column selection signals, one of which is selectively enabled, to store an external data in a memory cell of an internal circuit or to output a data stored in a memory cell of an internal circuit.

2. The semiconductor device of claim 1, wherein the section signal is generated by retarding the pre-section signal by a first delay time when the first test mode signal is enabled.

3. The semiconductor device of claim 1, wherein the section signal is generated by retarding the pre-section signal by a second delay time when the second test mode signal is enabled.

4. The semiconductor device of claim 1, wherein the section signal generator includes:

a delay signal generator suitable for retarding the pre-section signal by a delay time, which is set according to a level combination of the first and second test mode signals, to generate first and second delay signals;
a selection signal generator suitable for generating first and second selection signals, one of which is selectively enabled according to a logic level of a test command signal; and
a multiplexer suitable for outputting one of the first and second delay signals as the section signal according to a level combination of the first and second selection signals.

5. The semiconductor device of claim 4, wherein the delay signal generator includes:
   a first delay unit configured to be activated to latch the pre-section signal and suitable for retarding the latched pre-section signal to generate the first delay signal, when the first test mode signal is enabled; and
   a second delay unit configured to be activated to latch the first delay signal and suitable for retarding the latched first delay signal to generate the second delay signal, when the second test mode signal is enabled.

6. The semiconductor device of claim 4, wherein the multiplexer includes:
   a first transmitter suitable for outputting the first delay signal as the section signal when the first selection signal is enabled; and
   a second transmitter suitable for outputting the second delay signal as the section signal when the second selection signal is enabled.

7. A semiconductor device comprising:
   a test mode signal generator suitable for generating first and second test mode signals which are sequentially enabled according to a logic level of a test command signal;
   a section signal generator suitable for generating a section signal by retarding a pre-section signal by a delay time that is set according to a level combination of the first and second test mode signals; and
   a decoder suitable for decoding address signals in response to a pulse of the section signal to generate column selection signals, one of which is selectively enabled, to store an external data in a memory cell of an internal circuit or to output a data stored in a memory cell of an internal circuit.

8. The semiconductor device of claim 7, wherein the section signal is generated by retarding the pre-section signal by a first delay time when the first test mode signal is enabled.

9. The semiconductor device of claim 7, wherein the section signal is generated by retarding the pre-section signal by a second delay time when the second test mode signal is enabled.

10. The semiconductor device of claim 7, wherein the section signal generator includes:
    a delay signal generator suitable for retarding the pre-section signal by a delay time, which is set according to a level combination of the first and second test mode signals, to generate first and second delay signals;
    a selection signal generator suitable for generating first and second selection signals, one of which is selectively enabled according to a logic level of the test command signal; and
    a multiplexer suitable for outputting one of the first and second delay signals as the section signal according to a level combination of the first and second selection signals.

11. The semiconductor device of claim 10, wherein the delay signal generator includes:
- a first delay unit configured to be activated to latch the pre-section signal and suitable for retarding the latched pre-section signal to generate the first delay signal, when the first test mode signal is enabled; and
- a second delay unit configured to be activated to latch the first delay signal and suitable for retarding the latched first delay signal to generate the second delay signal, when the second test mode signal is enabled.

12. The semiconductor device of claim 10, wherein the multiplexer includes:
- a first transmitter suitable for outputting the first delay signal as the section signal when the first selection signal is enabled; and
- a second transmitter suitable for outputting the second delay signal as the section signal when the second selection signal is enabled.

13. The semiconductor device of claim 7, further comprising a pre-section signal generator suitable for generating the pre-section signal including a pulse which is created in response to receiving a read command signal or a write command signal.

14. A semiconductor device comprising:
- a pre-section signal generator suitable for generating a pre-section signal including a pulse which is created in response to a received read command signal or a write command signal;
- a section signal generator suitable for generating a section signal by retarding the pre-section signal by a delay time that is set according to a level combination of first and second test mode signals; and
- a decoder suitable for decoding address signals in response to a pulse of the section signal to generate column selection signals, one of which is selectively enabled, to store an external data in a memory cell of an internal circuit or to output a data stored in a memory cell of an internal circuit.

15. The semiconductor device of claim 14, wherein the section signal is generated by retarding the pre-section signal by a first delay time when the first test mode signal is enabled.

16. The semiconductor device of claim 14, wherein the section signal is generated by retarding the pre-section signal by a second delay time when the second test mode signal is enabled.

17. The semiconductor device of claim 14, wherein the section signal generator includes:
- a delay signal generator suitable for retarding the pre-section signal by a delay time, which is set according to a level combination of the first and second test mode signals, to generate first and second delay signals;
- a selection signal generator suitable for generating first and second selection signals, one of which is selectively enabled according to a logic level of a test command signal; and
- a multiplexer suitable for outputting one of the first and second delay signals as the section signal according to a level combination of the first and second selection signals.

18. The semiconductor device of claim 17, wherein the delay signal generator includes:
- a first delay unit configured to be activated to latch the pre-section signal and suitable for retarding the latched pre-section signal to generate the first delay signal, when the first test mode signal is enabled; and
- a second delay unit configured to be activated to latch the first delay signal and suitable for retarding the latched first delay signal to generate the second delay signal, when the second test mode signal is enabled.

19. The semiconductor device of claim 17, wherein the multiplexer includes:
- a first transmitter suitable for outputting the first delay signal as the section signal when the first selection signal is enabled; and
- a second transmitter suitable for outputting the second delay signal as the section signal when the second selection signal is enabled.

20. A semiconductor device comprising:
- a test mode signal generator suitable for generating first and second test mode signals which are enabled according to a logic level of a test command signal;
- a section signal generator suitable for generating a section signal by retarding a pre-section signal by a delay time that is set according to a voltage level combination of the first and second test mode signals; and
- a pre-section signal generator suitable for generating the pre-section signal including a pulse which is created in response to receiving a read command signal or a write command signal.

* * * * *